United States Patent [19]

Vinouze et al.

[11] Patent Number: 5,081,004
[45] Date of Patent: Jan. 14, 1992

[54] METHOD TO PRODUCE A DISPLAY SCREEN WITH A MATRIX OF TRANSISTORS PROVIDED WITH AN OPTICAL MASK

[75] Inventors: Bruno Vinouze, Port-Blanc; Hugues Lebrun, Trevou-Treguignec, both of France

[73] Assignee: L'Etat Francais represente par le Ministre des Postes, des Telecommunications et de l'Espace (Centre National D'Etudes des Telecommunications, France

[21] Appl. No.: 430,890

[22] Filed: Nov. 2, 1989

[30] Foreign Application Priority Data

Nov. 8, 1988 [FR] France .................. 88 14562

[51] Int. Cl.⁵ ............................................ H01L 21/84
[52] U.S. Cl. ...................................... 430/311; 430/313; 430/317; 430/319; 430/20
[58] Field of Search ............... 430/20, 313, 317, 319

[56] References Cited

U.S. PATENT DOCUMENTS 4,389,481  6/1983  Poleshuk et al. ................ 430/319
4,715,930 12/1987  Diem ................................ 430/313
4,827,326  5/1989  Altman et al. .................. 430/313

FOREIGN PATENT DOCUMENTS 0179915  7/1986  European Pat. Off. .
0231953  8/1987  European Pat. Off. .
0267825  5/1988  European Pat. Off. .
0271313  6/1988  European Pat. Off. .

OTHER PUBLICATIONS

Proceeding of the Society for the Information Display, vol. 27 (Tomihisa)(1986).
IBM Technical Disclosure Bulletin (vol. 29) (1986).
Patent Abstracts (vol. 7, No. 286)(Toshiaki Ogata) (1983).
Patent Abstracts, vol. 11, No. 212 (Kenichi Oota)(2-1987).
Patent Abstracts, vol. 11, No. 355 (Kenichi Oota)(6-1987).
Patent Abstracts, vol. 10, No. 7 (Tooru Sakai)(8-1985).

Primary Examiner—Marion E. McCamish
Assistant Examiner—S. Rosasco
Attorney, Agent, or Firm—Pearne, Gordon, McCoy & Granger

[57] ABSTRACT

Method for producing a display screen with a matrix of transistors provided with an optical mask. This method consists of depositing on a substrate (100) a layer of black polyimide (102) absorbing the visible light and followed by a layer of photosensitive resin, of insolating the resin through a mask masking the channels of the transistors to be embodied, of eliminating the zones insolated with the resin and the sub-adjacent zones of the polyimide, of depositing an ITO layer (106) on the unit, of eliminating the rest of the resin and the ITO surmounting said resin so as to form the drains/sources of the transistors, of successively depositing a layer of hydrogenated amorphous silicon (110), a layer of silicon nitride (112) and a layer of aluminium (114), then of photoengraving the stack of these layers so as to form the grid of the transistors, and finally to render passive the unit with a layer of silicon (116).

4 Claims, 3 Drawing Sheets

METHOD TO PRODUCE A DISPLAY SCREEN WITH A MATRIX OF TRANSISTORS PROVIDED WITH AN OPTICAL MASK

FIELD OF THE INVENTION

The object of the present invention is to provide a method to produce an active matrix display screen based on capacitors and thin layers of transistors, said transistors being provided with an optical mask. The present invention is applicable in particular to the embodiment of liquid crystal display circuits.

BACKGROUND OF THE INVENTION

Circuits with thin layers of transistors (T.L.T) are mainly used in the production of active matrix display screens. In this type of screen, an electronic memory formed of memory points distributed over the entire surface of the screen stores the video signal throughout the duration of the image. The electro-optical transducer (for example, a liquid crystal) is in contact with each memory point and is excited throughout the duration of an image, whereas, in systems without any electronic memory, the transducer is only excited during the duration of a line. The optical effect and the authorized multiplexing rate are accordingly much more significant.

The TLTs make it possible to embody such an electronic memory on a glass substrate. Each memory point is situated at the crossing of one line and one connection column and is constituted of two parallel transistors and a capacitor. In the case where the transducer is a liquid crystal, the reinforcements of the capacitor may be constituted by the electrodes of the liquid crystal cell itself. The memory point is thus brought back to two TLTs and one capacitor, one of the reinforcements of said capacitor being constituted by an electrode disposed on the wall of the cell which contains the TLTs, the other reinforcement being constituted by the counter-electrode disposed on the other wall of the cell.

Such a structure is represented on FIG. 1: part A is a top view of one point of the active matrix and part B is a sectional view along the line b-b of the part A.

Part A shows a conductive column 2 and a conductive line 4 constituting the addressing columns and lines of the points of the active matrix, two TLTs 6 and 7 in parallel, and one transparent electrode 8 constituting one of the reinforcements of the capacitors or elementary display points of the active matrix.

Each column 2 is provided with a cross 10 and each electrode 8 with a finger 12. The crossings of the line 4 with the column 2 and the cross 10 defining the drains D of the TLTs and the crossing of the line 4 with the finger 12 define the source S of the TLTs. The part of the line 4 situated between the column 2 and the cross 10 constitute the grid G of the TLTs.

Part B shows firstly a lower insulating and transparent wall 20 bearing the column 2, the finger 12 of the elementary display point and the cross 10; these conductive elements 2, 10 and 12 are covered by a layer of hydrogenated amorphous silicon and then an insulating grid layer 24 supporting the conductive lines 4. This unit is covered with a self-aligning layer 26 intended to be in contact with the electro-optical material 28 (liquid crystal).

In addition, the display screen includes a transparent counter-electrode 30 supported by an upper insulating transparent wall 32.

For color display, colored filters 34, usually about three (red, blue and green), need to be provided on the counter-electrode 30 and be in contact with the material 28.

Next to the active matrixes, other circuits may be embodied with TLTs and, for example, all or part of the registers to be offset.

This screen is intended to be lit up via the rear with fluorescent tubes and display is designed to be observed via the lower face, as shown on part B of FIG. 1. The grid metal, namely the one constituting the lines 4, ensures protection of the TLTs 6 against the rear light of the display screen. On the other hand, the "underside" of the TLTs is exposed to the ambient observation light. If this light is intense, a photo-current is generated in the amorphous silicon layer 24 reducing the contrast of the screen as the Ion/Ioff ratio diminishes; Ion and Ioff respectively represent the currents delivered by the transistors of one displayed point and one non-displayed point.

By using amorphous silicon of low thickness ($<50$ nm), this photo-current is attenuated but is nevertheless adequate so as to reduce the contrast. Also, an optical mask needs to be provided under the transistors so as to use the screen with the ambient light and thus ensuring a constant image.

In order to make an optical mask absorbing the light under the TLTs, a metal is generally used which is engraved. As the optical mask is a conductor, a passivation layer is required. Such a structure is described in the article in Japan Display 1983, p. 211 by Canon.

This technique requires the use of two depositings under vacuum, which is relatively constricting, as well as a specific masking level so as to define the form and location of the optical mask under the transistors. This additional masking level strictly requires self-aligning accuracy of this mask with respect to the source and drain contact of the transistors. Accordingly, this technique is complex and delicate.

The object therefore of the invention is to overcome these drawbacks by providing an optical mask of the "underside" of the transistors with an active matrix, while reducing the number of masking levels and by ensuring a self-positioning of these optical masks with respect to the sources and drains of the transistors.

SUMMARY OF THE INVENTION

Accordingly, the object of the invention is to provide a method to produce an active matrix display screen formed of points each constituted by a transistor consisting of thin layers and a capacitor and comprising conductive lines and columns for the addressing of the points, said method consisting of:

a) depositing on an electric insulating substrate a layer of a first electric insulating material absorbing the visible light and soluble in the developer of a positive photosensitive resin, b) depositing a layer of said resin on the absorbing layer, c) insolating the resin through a negative mask masking the channels of the transistors to be embodied, d) eliminating the insolated zones of the resin and the sub-adjacent zones of the absorbing layer with said developer, e) depositing a layer of a first transparent conductive material on the unit, f) eliminating the rest of the resin and the first conductive material covering said resin so as to form the sources and drains of the transistors in the first conductive material, g) depositing a layer of hydrogenated amorphous layer on the unit, h) depositing a layer of a second electric insulating material on the silicon layer, i) depositing a layer of a second conductive material on the layer of the second insulating material, j) photoengraving the stack formed by the layers of the second conductive material, the second insulating material and the silicon so as to form the grid of the transistors, and k) rendering passive the unit by depositing a layer of a third electric insulating material.

The method of the invention does not comprise any critical stage and solely comprises two masking levels. It makes it possible to suppress the photo-current of the thin-layered transistors due to the ambient lighting of the display screen.

The method of the invention also makes it possible to use a relatively thick (>200 nm) amorphous silicon layer, which provides a more improved material and inparticular control of its less critical thickness.

In addition, the channel of the transistors is laid on an absorbing and electrically insulating material block which also serves as a passivation material. This is particularly advantageous when the insulating substrate is made of glass. In fact, there is no longer any risk of pollution of the amorphous silicon by the ions contained in the glass of the substrate. Accordingly, a low-priced glass can be used, such as lime/sodium glass, thus reducing the cost of the display screen.

Advantageously, the absorbing material is a polymerizable resin containing opaque colorings, the polylmerization of this resin in particular being effected immediately before depositing the hydrogenated amorphous silicon layer.

The object of the invention is also to provide an active matrix display screen obtained by the previously described method. According to the invention, this matrix is formed on an electric insulating substrate and comprises points, conductive lines and columns for addressing of the points, each point being constituted by a capacitor and a thin-layered transistor mainly including an optical mask made of an electric insulating material situated under the channel of the transistor and directly on the substrate, one source and one drain both self-positioned with respect to the optical mask and in direct contact with the substrate, as well as a grid surmounting the optical mask and separated from the latter by the stacked hydrogenated amorphous silicon and an electric insulating material, the amorphous silicon being in contact with the source and the drain.

The technique for producing the sources and drains in the method of the invention, known as the "lift-off" technique, ensures a self-positioning of the sources and drains of the transistors with respect to the optical mask of the latter. Furthermore, if the thickness of the absorbing material and the first conductive material, in which the sources and drains of the transistors are defined, is selected carefully and correctly, a structure is obtained under the plane hydrogenated amorphous silicon, that is a step-free structure, it being a known fact that the passages of steps can be sources of defects in the transistors and with the environments of addressing lines and columns.

BRIEF DESCRIPTION OF THE DRAWINGS

Other characteristics and advantages of the invention shall appear more readily from a reading of the following description, given by way of explanation and being in no way restrictive, with reference to the annexed FIGS. 2 to 4, FIG. 1 already having been described.

DETAILED DESCRIPTION OF THE PREFERRED EMBODIMENTS

Figure 1A:
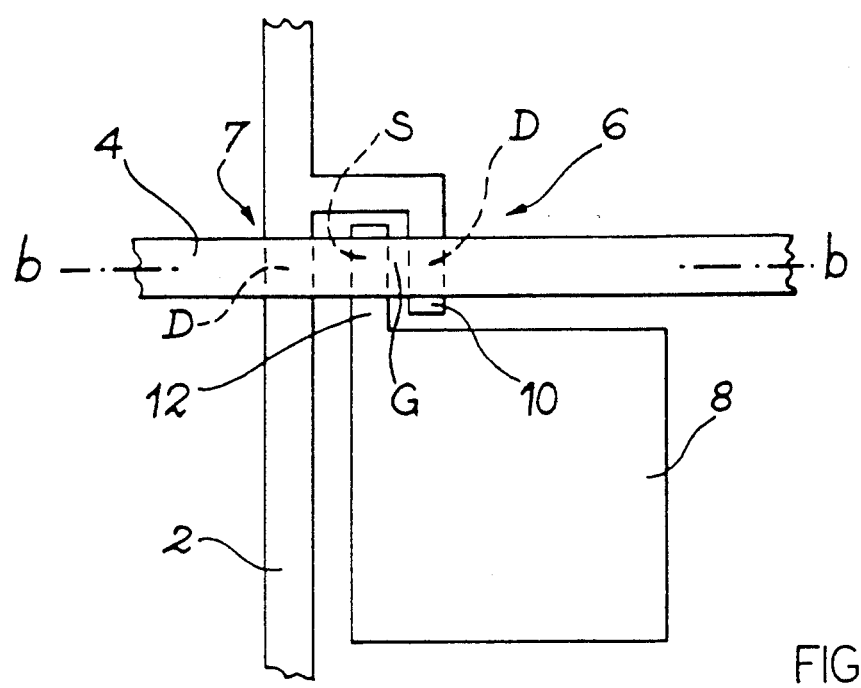

So as to simplify the description relating to the production according to the invention of a display screen with reference to FIG. 2, this FIGURE is solely given for the production of a thin-layered transistor of one point of an active matrix of this display screen.

The first stage for producing an optically masked thin-layered transistor consists, as shown on part A of FIG. 2, of depositing with a plate whirler on a lime/sodium type glass substrate 100 a layer of polyimide 102 containing colorings from the family of anthraquinones, azo compounds and phthalocyanines so as to render this polyimide layer opaque and then of prepolymerizing the latter at 150° C. for 30 minutes. The polyimide is preferably the one commercialized by BREWER SCIENCE, P.O. Box GG ROLLA, M065401, USA.

Then onto the black polyimide layer a layer of positive photosensitive resin is deposited (for example, the SHIPLEY 1350H type) which is dried at 100° C. for 30 minutes. This resin is then insolated through a negative mask 105 ensuring masking of the channel of the transistor to be embodied, this insolation being effected with ultraviolets rays. Then the exposed resin is developed, the aim of this being to eliminate the exposed resin and to solubilize the polyimide not protected by the exposed resin. The structure obtained is the one represented on part B. Thus, the future channel of the transistor has been delimited. The developer used is, for example, the SHIPLEY MF 312 developer.

With the resin mask 104 still in place, a transparent conductive layer 106 is deposited by evaporation, such layer being, for example, a layer of tin and indium oxide, and possibly a layer of metal 108, such as chromium, so as to subsequently obtain the level 1 of the plane structure (FIG. D). To this effect, the overall thickness of the layers 106 and 108 needs to be equal to the thickness of the polyimide layer 102. For example, the layer 102 may have a thickness of 1000 nm, the layer 106 a thickness of 700 nm and the layer 108 a thickness of 300 nm.

The layers 106 and 108 are deposited on the unit of the structure, that is on the exposed parts of the structure 100 and on the remaining resin 104.

Then the resin 104 is dissolved in the BREWER SCIENCE stripper, thus eliminating the metals 106 and 108 deposited on the resin. Thus, the respective source and drain contacts S and D of the thin-layered transistor are obtained and the channel of the transistor is laid bare, as shown on part D of FIG. 2. Then an annealing under vacuum is subsequently carried out up to a temperature of about 400° C. so as to polymerize all the remaining black polyimide 102 without resulting in any significant loss of the absorbance of this material.

Production of the transistor is continued, as shown on part E of FIG. 2, by depositing a layer of hydrogenated amorphous silicon 110, a layer of silicon nitride 112 and finally a layer of aluminium 114 on the unit of the structure. The layers 110 and 112 are obtained by means of plasma assisted vapor phase chemical depositing (PECVD), the aluminium 114 being deposited by evaporation or pulverization. Then an engraving is carried out of the stack of the layers 114, 112, 110 and 108 by conventional means so as to define the grid of the transistor.

The final stage of the method consists of rendering passive the unit of the structure by depositing a layer of silicon nitride 116.

The method described with reference to FIG. 2 is compatible with the method for producing an active matrix display screen described in the document EP-A-0-103-523 and in the document FR-A-2 571 893.

During production of a complete display screen, the negative mask 105 used to mask the channel of the transistors is also used to mask one of the reinforcements of the capacitors, as well as the conductive columns of the display screen to be embodied. These reinforcements 8 and columns 2 (FIGS. 1, 3) are then formed at the same time as the source and drain contacts of the transistors by means of the "lift-off" technique. In addition, the addressing lines 4 of the display screen are simultaneously formed at the grid of the transistor in the conductive layer 114.

Figure 3:
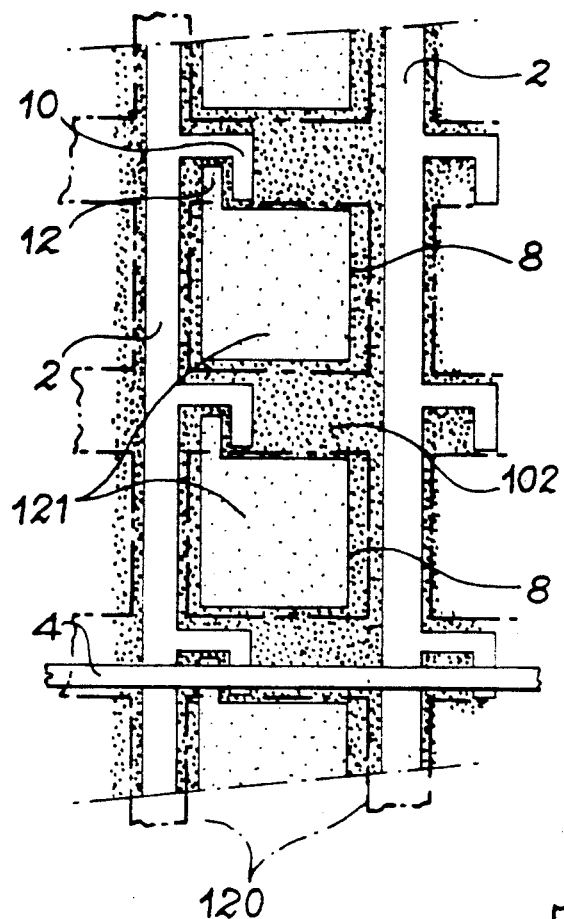
FIG. 3 shows a top view of the front face of a display screen obtained by the method of the invention.

To this effect, FIG. 3 shows a top view of the front face of one part of a display screen obtained by the method of the invention. This FIGURE also shows the addressing columns 2, the ITO transparent electrodes 8, the crosses 10 integral with the columns 2, and the fingers 12 of the display points integral with the electrodes 8.

The method of the invention makes it possible to cover all the zones encompassing the electrodes 8 and the columns 2, respectively equipped with their cross 10 and their fingers 12, with black polyimide 102. It is then possible to deposit an optical mask, symbolized by the dot-and-dash lines shown on FIG. 3 and bearing the reference 120, on the counter-electrode 30 (FIG. 1) slightly wider than the columns 2 without resulting in any critical alignment of the counter-electrode 30 with respect to the active matrix, so that the elementary display points 8 transmit the light.

The opening percentage of the display screen corresponding to the light transmission percentage is the ratio of the actual effective surface area to display on the total screen surface. By virtue of the method of the invention, the effective surface area 121 is equal to the surface of the electrodes 8. In this case, the opening percentage is 71%.

Figure 1B:
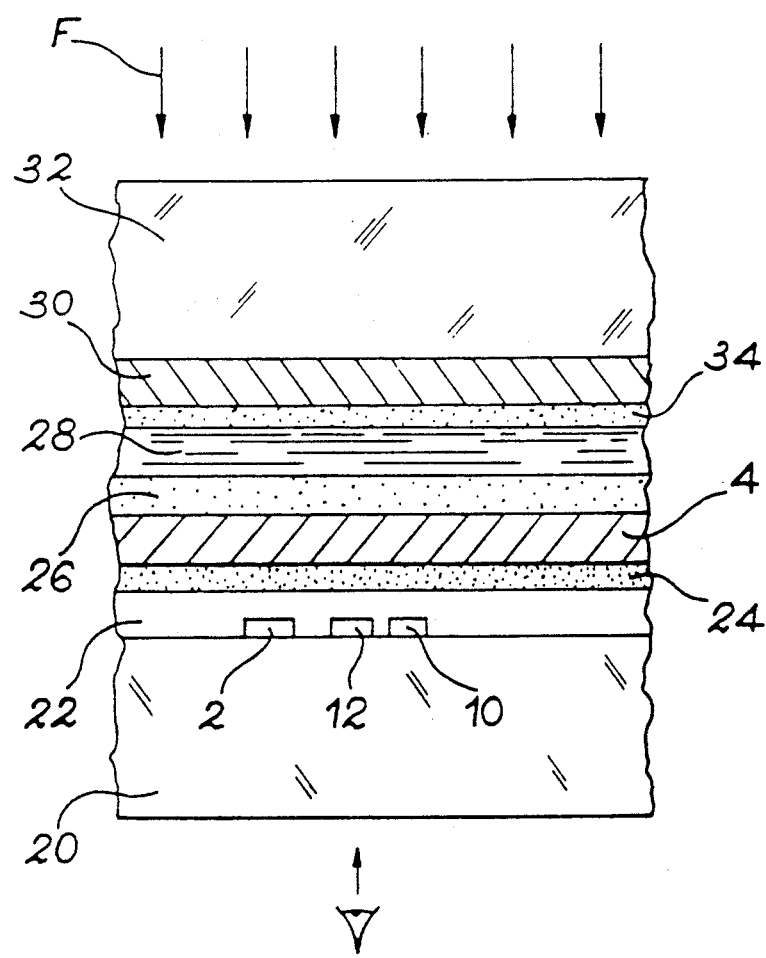
Figure 2A:
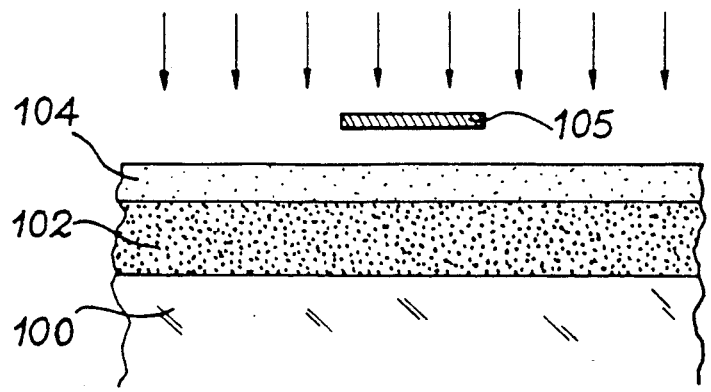
FIG. 2A–E shows a sectional view of the various stages of the method of the invention applied to the production of a liquid crystal display screen.
Figure 2B:
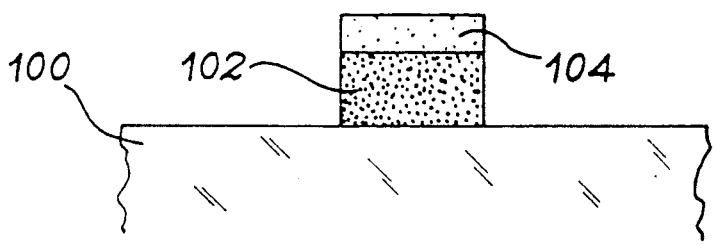
Figure 2C:
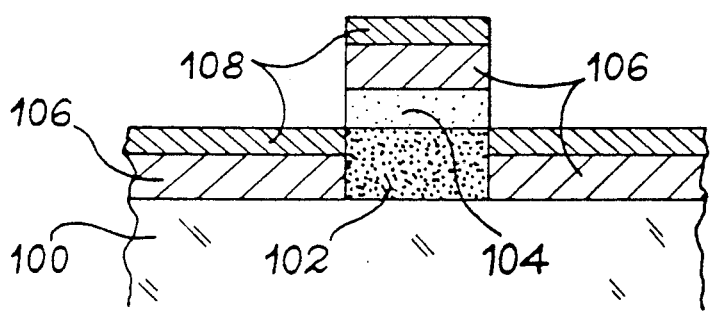
Figure 2D:
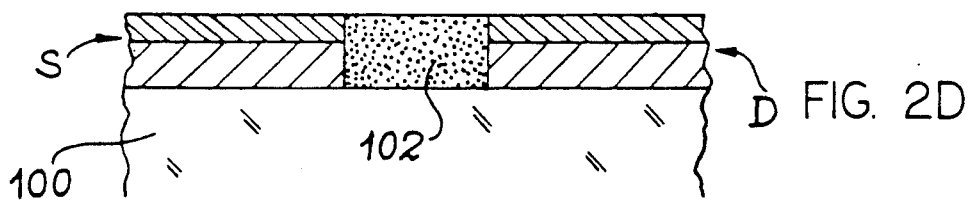
Figure 2E:
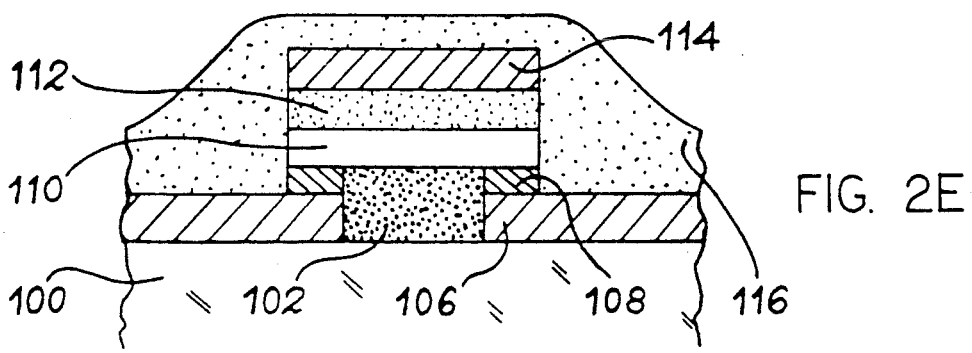
Figure 4:
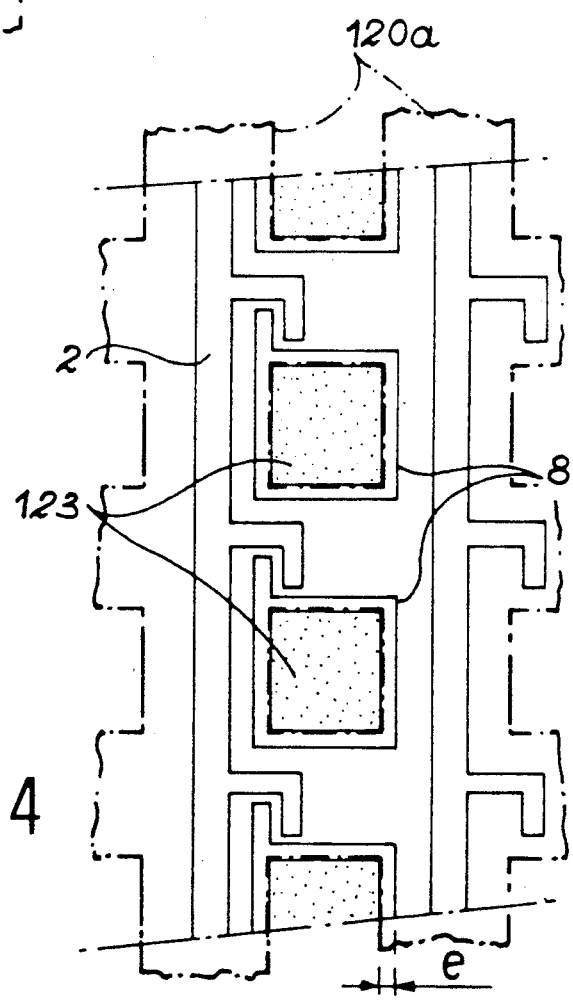
FIG. 4 shows a top view of the front face of a display screen obtained by the methods according to the prior Art.

In a conventional case shown on FIG. 1, there is no black polyimide around the elementary display points. Also, it is necessary to provide on the counter-electrode 30 an optical mask 120a symbolized by the dot-and-dash lines, said mask being wider than the columns 2, as shown on FIG. 4, indeed covering with a thickness e of about 10 microns the electrodes 8 and thus the elementary display points, due to the alignment tolerances between the counter-electrode and the active matrix. This covering e then reduces the effective surface area 123 of the elementary display point. In this case, the opening percentage of the screen is 63%.

What is claimed is:

1. Method to produce a display screen with an active matrix formed of display points each constituted by a thin film transistor and a capacitor and comprising conductive lines and columns for addressing the display points, said method consisting of:
   a) depositing on an electric insulating substrate a layer of a polymerizable resin containing opaque dyes, said polymerizable resin being electrically insulating and absorbing the visible light and soluble in a developer of a positive photosensitive resin,
   b) depositing on the absorbing polymerizable resin layer one layer of said photosensitive resin,
   c) insolating the photosensitive resin through a negative mask masking the channels of the transistors, a first armature of the capacitors and the columns to be embodied, said negative mask being eliminated thereafter,
   d) eliminating the insolated zones of the photosensitive resin and the sub-adjacent zones of the absorbing polymerizable resin layer in front of said insolated zones with said developer so as to form an optical mask in said insolating material on said channels and around the first armatures and columns to be embodied,
   e) depositing at least one layer of a first conductive transparent material on the structure obtained in d),
   f) eliminating the remainder of the photosensitive resin and the first conductive material covering said resin so as to form the sources and drains of the transistors, and the first armatures and columns in the first conductive material,
   g) polymerizing the polymerizable resin,
   h) depositing a layer of hydrogenated amorphous silicon on the structure obtained in g),
   i) depositing a layer of a first electric insulating material on the silicon layer,
   j) depositing a layer of a second conductive material on the first insulating material,
   k) photoengraving the stack formed by the layers of the second conductive material, the second insulating material and the silicon so as to form the grid of the transistors and the lines, and
   l) rendering passive the structure obtained in k) by depositing a layer of a second electric insulating material.

2. Method according to claim 1, wherein the polymerization of the polymerizable resin is obtained by an annealing.

3. Method according to claim 1, wherein the polymerizable resin is a polyimide.

4. Method according to claim 1, wherein the stage e consists of depositing two conductive layers, a first and a third conductive layers, whose thickness is such that the thickness of the first and third conductive material is equal to the thickness of the absorbing polymerizable resin.

* * * * *